United States Patent
Tsai et al.

(10) Patent No.: US 9,145,601 B2
(45) Date of Patent: Sep. 29, 2015

(54) MATERIAL FOR EXPANDING THE RANGE OF LIGHT ABSORPTION IN AN ORIGINAL CONSTITUTION MATERIAL

(75) Inventors: Din Ping Tsai, Taipei (TW); Hung Ji Huang, Chuanghua (TW)

(73) Assignee: Instrument Technology Research Center, National Applied Research Laboratories, Hsinchu (TW)

( * ) Notice: Subject to any disclaimer, the term of this patent is extended or adjusted under 35 U.S.C. 154(b) by 553 days.

(21) Appl. No.: 12/913,212

(22) Filed: Oct. 27, 2010

(65) Prior Publication Data

US 2012/0107621 A1     May 3, 2012

(51) Int. Cl.
| | |
|---|---|
| *B32B 5/16* | (2006.01) |
| *F21V 9/00* | (2015.01) |
| *B32B 17/06* | (2006.01) |
| *B32B 18/00* | (2006.01) |
| *B82Y 30/00* | (2011.01) |
| *C23C 14/08* | (2006.01) |

(52) U.S. Cl.
CPC ............... *C23C 14/083* (2013.01); *B82Y 30/00* (2013.01)

(58) Field of Classification Search
None
See application file for complete search history.

(56) References Cited

U.S. PATENT DOCUMENTS

| 4,623,396 A | * | 11/1986 | Kimura et al. ................. 106/417 |
| 5,694,240 A | * | 12/1997 | Sternbergh .................... 359/359 |
| 2007/0178315 A1 | * | 8/2007 | Thomas et al. ............... 428/426 |

FOREIGN PATENT DOCUMENTS

| JP | 2001062310 A | * | 3/2001 |
| WO | WO02/57508 A2 | * | 7/2002 |

* cited by examiner

*Primary Examiner* — David Sample
(74) *Attorney, Agent, or Firm* — Muncy, Geissler, Olds & Lowe, P.C.

(57) ABSTRACT

A composite material which expands the range of light-absorption of an original constitution material, which is formed through two or more total oxides contacting and fixing to the oxygen reduced oxides with the same composition of materials as the total oxides. The composite material can excite the light-driven reaction to achieve an enlarged absorption range of the light band. In the contacting and fixing process of the composite material, a calcination process is not required, so that the process can be applied to a substrate which is plastic or not suitable for high-temperature heating.

1 Claim, 5 Drawing Sheets

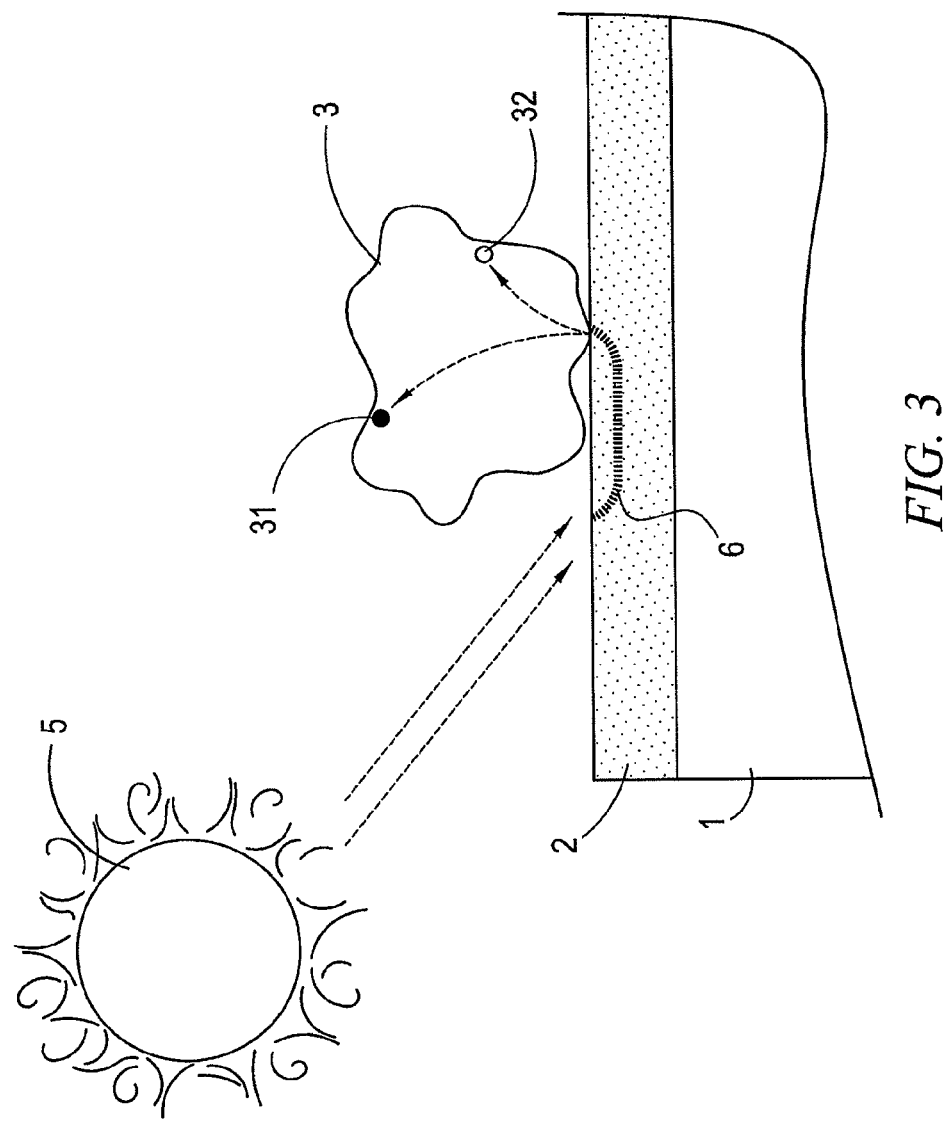

MATERIAL FOR EXPANDING THE RANGE OF LIGHT ABSORPTION IN AN ORIGINAL CONSTITUTION MATERIAL

BACKGROUND OF THE INVENTION

1. Field of the Invention

The present invention relates to a composite material for expanding the rage of light absorption for an original constitution material, which is applied to green technologies with photo-induced physical or chemical reaction requirements, such as chemical engineering, environmental engineering, and solar cell application, to increase the reaction efficiency of the operation of the original materials.

2. Brief Description of the Related Art

These years, increasing consumption of petroleum energy has caused a capacity shortage of petroleum energy. Moreover, the use of petroleum energy increases carbon dioxide emissions so that the greenhouse effect becomes more serious. To solve the problems associated with the capacity shortage of petroleum energy and the related increase of carbon dioxide emissions, many scholars and experts have begun to find solutions in energy applications which improve and/or eliminate carbon dioxide emissions.

Energy development research, including harvesting and transforming solar rays into usable energy, provides a clean, welcoming, and important technology. In addition to solar cells with basic materials such as Si, Cd, and III-IV group, dye-sensitized photovoltaic cells based on $TiO_2$ draw huge attention and participation from many research and design staff. For reducing carbon dioxide in the atmosphere, semiconductor photocatalysts such as Titanium Dioxide, SiC, and GaP are used to carry out a photocatalytic reduction to carbon dioxide, and materials such as HCHO and $CH_3OH$ are produced.

Titanium Dioxide is one of the most important constituting materials in both of the above-mentioned green chemical technologies. The band gap energy of Titanium Dioxide is 3.2V, and only a UV band with wavelengths less than 400 nm can be absorbed and transformed by Titanium Dioxide into the necessary photochemical reaction energy. Therefore, enlarging the absorbable wavelengths of Titanium Dioxide for applications to the visible band, and increasing the operation efficiency of Titanium Dioxide, are important topics. There are also many corresponding modification of materials. However, a material modification method or technique is still required which is flexible, inexpensive, requires only a small quantity of materials, and can be achieved without a high-temperature process.

Based on the flaws on the conventional method mentioned above, the inventor of the present invention was eager to proceed with improvement and innovation. After many years of earnest research, the inventor successfully finished this material for expanding the range of light absorption for an original constitution material.

SUMMARY OF THE INVENTION

One object of the present invention is to provide a composite material which contacts and fixes to homogeneous materials with different degrees of oxidation. By contacting and fixing to more than one oxide or oxygen reduced oxide material, the goal of exciting the light-driven reaction to enlarge the absorption range of the light band is achieved.

The second objective of the present invention is to provide a composite material process which contacts and fixes to homogeneous materials with different degrees of oxidation. While combining oxide and hypoxia into a composite material, a calcination process is not required in the contacting and fixing process. Accordingly, the process can be applied to a substrate which is plastic or not suitable for high-temperature heating.

Another objective of the present invention is to provide a composition of composite materials, which composition is flexible, inexpensive, requires only a small quantity of materials, and can be achieved without a high-temperature process, so that the process is easier and faster.

In the process to accomplish this invention, a composite material for expanding the range of light absorption of an original constitution material coats or deposits an oxygen reduced oxide film on the substrate, or the substrate is an oxygen reduced oxide film itself. The oxygen reduced oxide of the oxygen reduced oxide film becomes a composite material after contacting and fixing to an oxide. After being lit by the sunlight or some light source, the light is received by the oxygen reduced oxide. Therefore, the light can be transmitted in the oxygen reduced oxide or transferred into the oxide which contacts and fixes to the oxygen reduced oxide. Thus, the composite material produces the phenomenon of electron-hole separation, and causes the photocatalyst reaction of the oxide.

BRIEF DESCRIPTION OF THE DRAWINGS

FIG. 3 is a process implementation diagram of a composite material which expands the range of light-absorption of an original constitution material;

DETAILED DESCRIPTION OF THE PREFERRED EMBODIMENTS

Figure 1A:
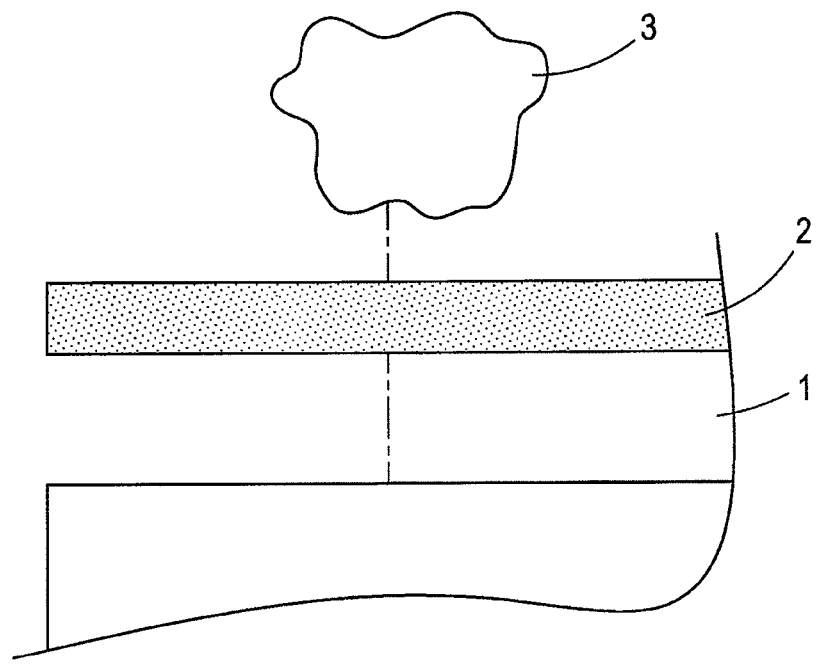
FIGS. 1A, 1B is a process decomposition diagram and composite diagram of a composite material which expands the range of light absorption of an original constitution material.
Figure 1B:
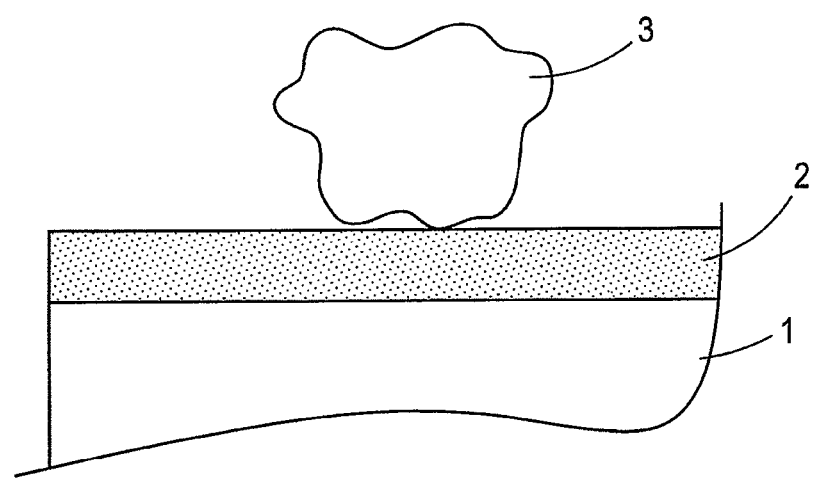
Figure 2A:
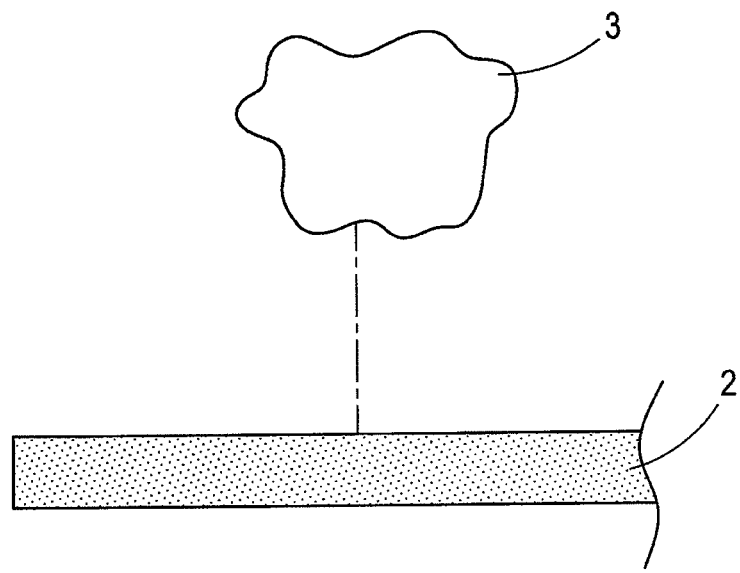
FIGS. 2A, 2B is another process decomposition diagram and composite diagram of a composite material which expands the range of light-absorption of an original constitution material.
Figure 2B:
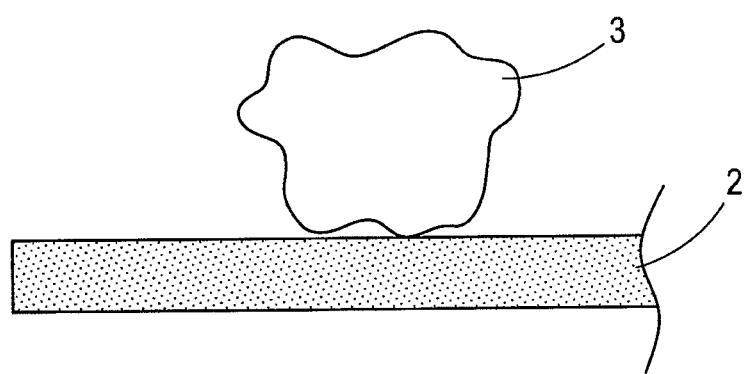

With reference to FIG. 1 and FIG. 2, an organigram of a composite material which expands the range of light-absorption of an original constitution material is shown, as provided by the present invention, mainly comprising:

a substrate 1, which is composed by a glass or plastic with structural supporting strength, therefore the oxygen reduced oxide particles are adapted to be coated or deposited on the substrate 1 and form an oxygen reduced oxide film 2 on the substrate 1 (please refer to the FIG. 1A to 1B); or the substrate 1 may be composed by Ti, W, Zn, Si, Pt, Ag, Cd, Fe, Sn, In, Sb, Bi, V, Mo, Pb, or Sr, or a semiconductor material itself or the complexes of the semiconductor material with other materials, and these materials enable the substrate 1 to be an oxygen reduced oxide film 2 (please refer to the FIG. 2A to 2B);

an oxygen reduced oxide film 2, in which the oxygen reduced oxide particles are adapted to be stacked or embedded on the oxygen reduced oxide film 2 to constitute the oxygen reduced oxide film 2; the oxygen reduced oxide particles of the oxygen reduced oxide film 2 consist of the following metals: Ti, W, Zn, Si, Pt, Ag, Cd, Fe, Sn, In, Sb, Bi, V, Mo, Pb, or Sr, or the semiconductor material itself, the oxide of the semiconductor material, or the complexes of the semiconductor material with other materials; and an oxide 3, which oxide 3 is composed by nano-oxide particles with photocatalyst activity after lighting by the light source; the oxide 3 is adapted to become a composite material after contacting and fixing to an oxygen reduced oxide of the oxygen reduced oxide film.

Besides, the oxide particles are configured to be coated or deposited on the substrate 1 and form an oxide film, or the oxide film itself is a substrate. The oxide film is adapted to become a composite material after the oxide 3 contacts and fixes to an oxygen reduced oxide, which oxygen reduced oxide has the same component material as the oxide 3 (not shown in the drawings).

If the material of the substrate 1 is plastic, the service life of the plastic substrate can be extended due to the reflectivity or absorptivity of UV light of the oxygen reduced oxide.

The oxide 3 and the oxygen reduced oxide 2 consist of the same composition of materials but with different oxygen content. The oxygen content of the oxygen reduced oxide 2 is not sufficient for the material to become a fully-oxidized state compound. The oxygen content of the oxygen reduced oxide is less than 50% compared to the fully-oxidized original material.

The oxide 3 and the oxygen reduced oxide particles of the oxygen reduced oxide film 2, such as a photocatalyst compound, are supposed to have specific functions after lighting by the light source.

Figure 4:
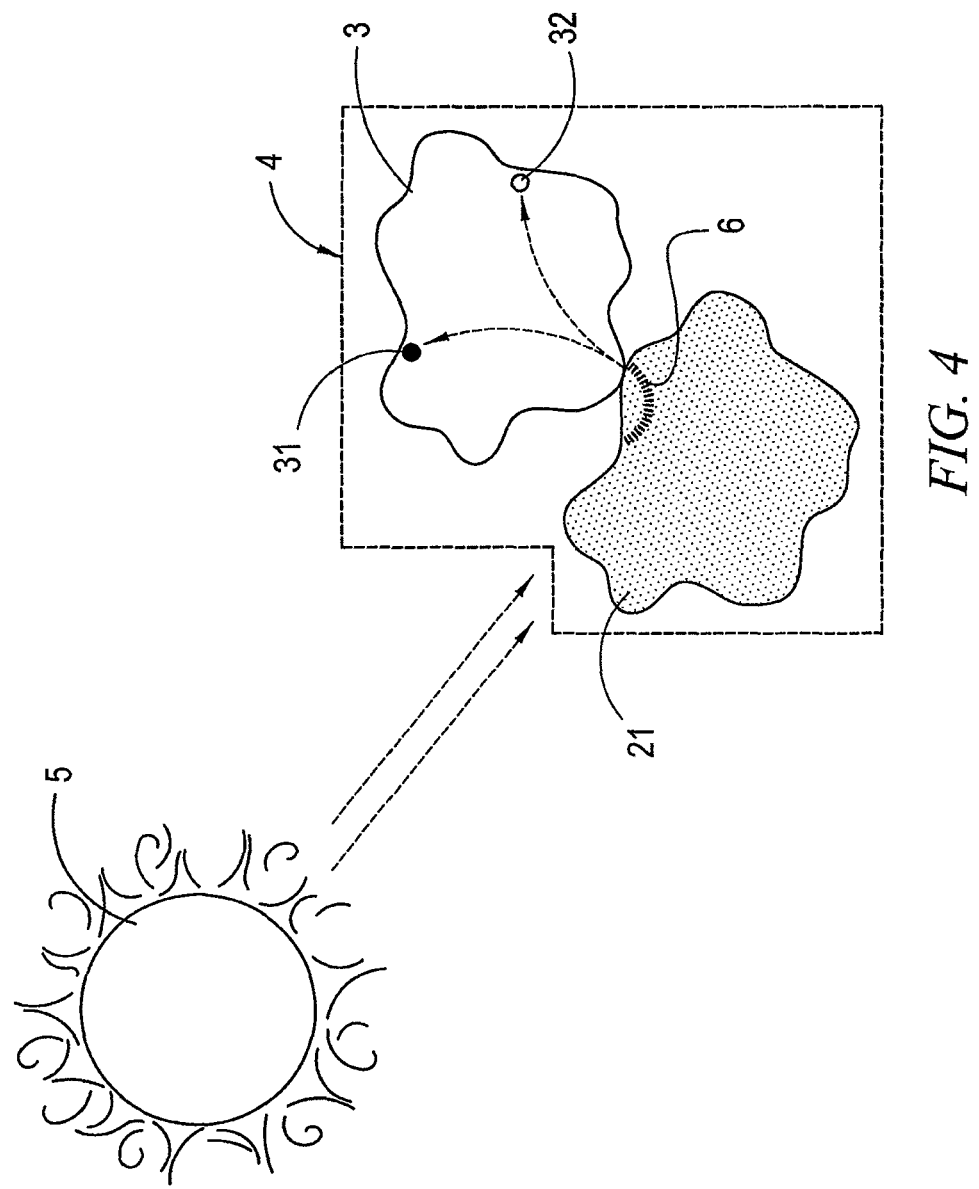
FIG. 4 is another process implementation diagram of a composite material which expands the range of light-absorption of an original constitution material.

Please refer to FIG. 3 and FIG. 4, in which is shown an embodiment diagram of a composite material which expands the range of light-absorption of an original constitution material provided by the present invention:

To coat or deposit an oxygen reduced oxide film 2 on the substrate 1, the oxygen reduced oxide particles 21 of the oxygen reduced oxide film 2 become a composite material 4 after contacting and fixing to an oxide 3. After absorbing a light source 5, such as sunlight or another light source, the energy 6 of the light is received by the oxygen reduced oxide particles 21. Therefore, the energy 6 can be transmitted in the oxygen reduced oxide particles 21 or transferred into the oxide particles 3 contacting and fixing to the oxygen reduced oxide particles 21. Thus, the energy 6 transmitted in the oxide 3 produces the phenomenon of electron-hole separation, and cause the photocatalyst reaction of the oxide. The light energy is transferred into other kinds of energy, such as sound, light, heat, power, electricity or magnetism.

Besides, the oxide particles are configured to be coated or deposited on the substrate 1 and form an oxide film, or the oxide film itself is a substrate. The oxide film is adapted to become a composite material after the oxide particles of the oxide film contact and fix to the oxygen reduced oxide particles 21 (not shown in the drawings).

The substrate 1, which itself is an oxygen reduced oxide film 2, comprises a lattice, and the lattice is more stable after a high temperature treatment (not shown in the drawings).

After contacting and the fixing occurs between the oxide 3 and the oxygen reduced oxide particles 21, a composite material 4 is formed. The composite material 4 is heated below 100 degrees Celsius for more than one hour to remove the water between the oxide 2 and the oxygen reduced oxide 21.

The contacting and fixing method of forming the composite material 4 between the oxide 3 and the oxygen reduced oxide particles 21, comprises: immersing the oxygen reduced oxide film 2 of the substrate 1 or the substrate itself being an oxygen reduced oxide film into the oxide colloidal solution; then taking the oxygen reduced oxide film 2 from the colloidal solution to evaporate and remove residual solvents.

The contacting and fixing methods which form the composite material 4 between the oxide 3 and the oxygen reduced oxide particles 21, include: high temperature heating, electron beam heating, argon ion acceleration impact, laser ablation, or chemical gas phase reaction, and the oxide 3 particles floating in the carrier gas and the vacuum contact and fix to the oxygen reduced oxide 21. Besides, after pouring the oxide 3 particles floating in the carrier gas into the colloidal solution with oxide particles, the oxide particles leave the colloidal solution and float in the carrier gas.

After the contacting and fixing between the oxide 3 and the oxygen reduced oxide particles 21, other kinds of materials, such as organic matters, oxides or metals, can be additionally added for advanced purposes.

The substrate 1, which itself is an oxygen reduced oxide film 2, comprises a lattice, and the lattice can be more stable after high temperature treatment.

EMBODIMENT

The embodiment of the present invention is described by an experiment where $TiO_2$ (oxide) contacts and fixes to an oxygen reduced $TiO_x$ (x<2) substrate (the substrate being an oxygen reduced oxide itself) to enlarge the absorption of the visible light range and to be applied to the photocatalyst decolorization reaction of the methyl orange solution.

Figure 5:
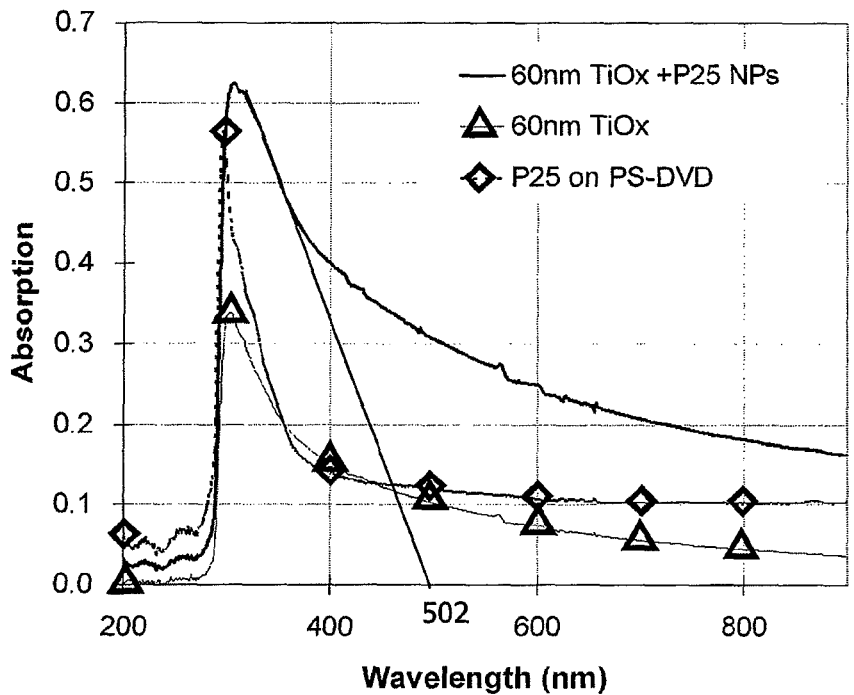
FIG. 5 is a spectral measurement diagram of a composite material which expands the range of light-absorption of an original constitution material.

The method of operation is as follows:

The $TiO_2$ is issued on a polystyrene substrate as a target to sputter a layer of 60 nm $TiO_x$ film (X<2), and produce an oxygen reduced $TiO_2$ film coated substrate without the subsequent treatment of heating above 100 degrees Celsius. The P-25 $TiO_2$ with an average particle size of 21 nm is dissolved in the deionized water at the rate of 10 g/L to produce a colloidal solution. The aforesaid oxygen reduced $TiO_2$ film coated substrate is put into the P-25 $TiO_2$ colloidal solution, and removed after putting it aside for 5 minutes. The heating plate is used to heat the aforesaid oxygen reduced $TiO_2$ film coated substrate, which is attached to the P-25 colloidal solution, to 90 degrees Celsius heat in the general atmospheric environment for 10 minutes. The residual solvents can therefore be evaporated and removed. The accomplished different-structuring composite materials substrate is rinsed for 1 minute with a lot of water, with the flow rate of water being greater than 3 L/min. The substrate is then allowed to air-dry naturally in the general atmospheric environment. Therefore, a film substrate with different degrees of oxidation composite materials coated is accomplished. The absorption spectrum is shown in FIG. 5. The main absorption peak boundary of the original P-25 $TiO_2$ nanoparticles is about 380 nm. After attaching the $TiO_2$ onto the $TiO_x$ substrate, the main absorption peak boundary is extended to 502 nm, which is in the visible band.

Figure 6:
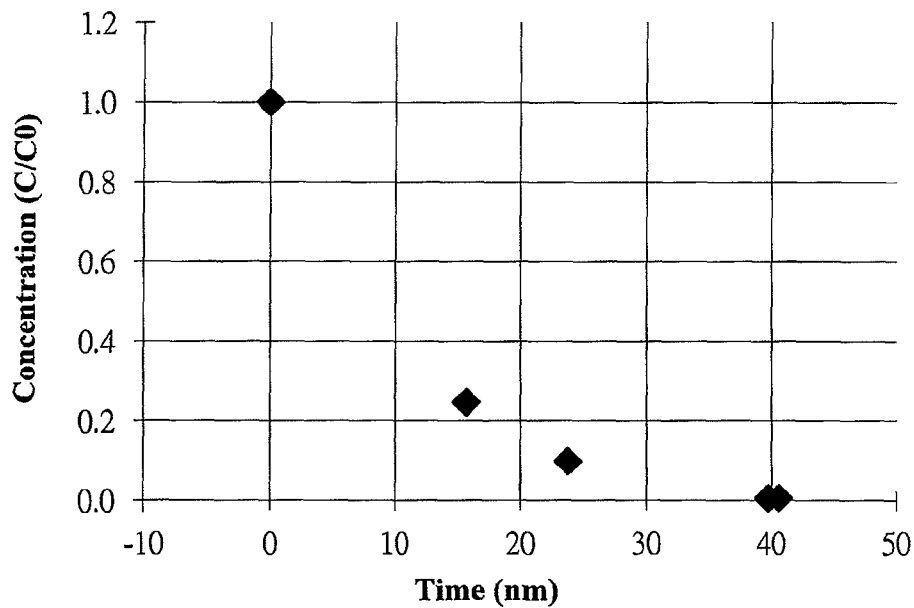
FIG. 6 is a variation diagram of a composite material which expands the range of light-absorption of an original constitution material applied to a photocatalyst decolorization reaction of the methyl orange solution, in which the concentration of the methyl orange and the original concentration ratio vary over time under the fluorescent radiation.

The film substrate, which has a total area of about 8 $cm^2$ and is coated with composite materials having different degrees of oxidation, is put into a methyl orange solution with a concentration of 4 uM of 50 cc. The variation over time of the concentration of the methyl orange solution under the UV-removed fluorescent lamp is observed. Please refer to FIG. 6, in which the concentration of the methyl orange solution is reduced to 15% below the original concentration under visible light irradiation after 24 hours. The different-structuring composite materials substrate can absorb light of the light band, which light could not be used by the original P-25 $TiO_2$ nanoparticles, and proceed with the photocatalyst decolorization reaction of the methyl orange solution.

The composite material which expands the range of light-absorption of an original constitution material provided by the present invention is superior to the conventional technologies in the following aspects:

1. The present invention accomplishes the enlargement of the absorption range of the light band by applying specific materials to a light-induced chemical reaction and light energy transfer reaction.

2. A high-temperature heating process is not required in the present invention, and the materials of the substrate can use plastic or glass to extend the substrate service life.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims

What is claimed is:

1. A composite material which expands the range of light-absorption of an original constitution material, comprising:
   a substrate, which is composed of a plastic with structural supporting strength;
   an oxygen reduced oxide film coated or deposited on the substrate, which is composed of oxygen reduced oxide particles; and
   an oxide, composed of nano-oxide particles, the oxide contacting and fixing to the oxygen reduced oxide particles of the oxygen reduced oxide film,
   wherein the composite material is devoid of water,
   wherein the oxygen reduced oxide particles of the oxygen reduced oxide film consist of titanium and oxygen,
   wherein the oxide and the oxygen reduced oxide consist of the same composition having different oxygen content, and
   wherein the oxygen content of the oxygen reduced oxide is less than 50% of a fully oxidize oxide.

* * * * *